United States Patent
Ohsawa

(10) Patent No.: US 7,076,203 B2
(45) Date of Patent: Jul. 11, 2006

(54) APPARATUS AND METHOD FOR RECEIVING TRANSMIT WAVE

(75) Inventor: Susumu Ohsawa, Kawagoe (JP)

(73) Assignee: Pioneer Corporation, Tokyo-to (JP)

( * ) Notice: Subject to any disclaimer, the term of this patent is extended or adjusted under 35 U.S.C. 154(b) by 432 days.

(21) Appl. No.: 10/245,338

(22) Filed: Sep. 18, 2002

(65) Prior Publication Data

US 2003/0064680 A1  Apr. 3, 2003

(30) Foreign Application Priority Data

Oct. 1, 2001 (JP) .......................... P2001-305650

(51) Int. Cl.
*H04H 1/00* (2006.01)

(52) U.S. Cl. .................. 455/3.05; 455/427; 455/115.1; 455/135

(58) Field of Classification Search ................ 455/3.05, 455/69, 115, 135, 516, 115.1, 563, 12.1, 427, 455/430, 13.4, 522, 452.2, 9; 327/563

See application file for complete search history.

(56) References Cited

U.S. PATENT DOCUMENTS

| 6,653,892 B1 * | 11/2003 | Park ........................... 327/563 |
| 6,714,771 B1 * | 3/2004 | Nagy et al. .............. 455/161.3 |
| 6,751,467 B1 * | 6/2004 | Cameron et al. ........... 455/516 |
| 2004/0081115 A1 * | 4/2004 | Parsa et al. ................. 370/320 |

FOREIGN PATENT DOCUMENTS

JP    H6-284062    10/1984

\* cited by examiner

*Primary Examiner*—Matthew Anderson
*Assistant Examiner*—Tan Trinh
(74) *Attorney, Agent, or Firm*—Nixon & Vanderhye, PC

(57) ABSTRACT

A transmit wave receiving apparatus comprises a wave receiving device, a signal monitoring device and a wave receiving control device. The wave receiving device receives transmit waves, which are transmitted from wave transmitting systems. The signal monitoring device monitors signal levels and signal qualities of the transmit waves, which are received by the wave receiving device. The wave receiving control device controls the wave receiving device so as to halt a wave receiving operation for the transmit wave having a large signal level, when it is judged from monitoring results by the signal monitoring device that the signal qualities of the transmit waves in all of the wave receiving systems are unfavorable.

16 Claims, 5 Drawing Sheets

APPARATUS AND METHOD FOR RECEIVING TRANSMIT WAVE

BACKGROUND OF THE INVENTION

Field of the Invention

The present invention relates to an apparatus and method for receiving transmit waves, which are utilized in a wave receiving system, which permits receiving of transmit waves through a plurality of systems.

A broadcast receiving apparatus, which is mounted on a movable body such as a vehicle for purposes of receiving broadcast information is recently becoming pervasive. With respect to a device for transmit waves on the air to such a broadcast receiving apparatus, a satellite provided with wave transmitting equipment can be utilized, in addition to ground stations established on the ground. Movement of the broadcast receiving apparatus, which is receiving the broadcast information, varies radio environment, leading to a possibility of degradation of receiving performance. It is therefore effective to constitute a broadcast receiving system, which permits the broadcast receiving apparatus to receive the same broadcast information through a plurality of radio station systems. It is possible to ensure a favorable signal quality for example by transmit waves on the air, which have been modulated on the basis of the common program, from both of the satellites and the ground stations, and providing the respective broadcast receiving apparatus with circuits, which are compatible with the respective radio station systems, so as to utilize two receiving signals.

In case where receiving operations are carried out through a plurality of radio station systems, the transmit wave transmitted through a certain radio station system differs from the transmit wave transmitted through the other radio station system in signal level and signal quality in accordance with radio environment. More specifically, when the receiving operations are carried out through two radio station systems so that the transmit wave received through the one system has a large signal level, but does not have a good signal quality, on the one hand, and the transmit wave received through the other system has a good signal quality, but does not have a large signal level, there is conceivable a situation that the one system has an adverse influence on the other system. In such a case, the one system in which the signal quality is deteriorated in accordance with a relative difference in signal level, may interfere with the other system to cause a strong jamming wave against it, thus degrading the signal quality, which would inherently have been favorable. Consequently, the qualities of both of the signals received through the two systems are deteriorated, thus causing a problem that a good receiving performance may not be maintained in the broadcast receiving apparatus.

SUMMARY OF THE INVENTION

An object of the present invention, which was made to solve the above-mentioned problems, is therefore to provide a transmit wave receiving apparatus, which is utilized in a broadcast receiving system and permits to prevent effectively degradation of receiving performance due to an adverse influence that is exerted by a certain radio station system in which the signal received through it has a large signal level and a deteriorated signal quality, on the other radio station system, when receiving transmit waves such as broadcast information through such a plurality of radio station systems.

According to the transmit wave receiving apparatus of the present invention, there are monitored the signal levels and the signal qualities as demodulated of a plurality of transmit waves, which are received from a plurality of wave transmitting systems through the different wave receiving system, and a wave receiving device is controlled on the basis of monitoring results. The control is made so as to halt a wave receiving operation for the transmit wave having a large signal level for a predetermined period of time, when it is judged from monitoring results by the signal monitoring device that the signal qualities of the transmit waves in all of the wave receiving systems are unfavorable. It is therefore possible to avoid a problem that, of a plurality of radio station systems, a certain radio station system in which the signal received through it has a large signal level and a deteriorated signal quality exerts an adverse influence on the other radio station system in which the signal received through it has a small signal level, but the signal quality thereof would inherently have been favorable, to deteriorate the signal quality. As a result, the adverse effect under radio environment such as a multi-pass system can be avoided, thus ensuring a favorable signal quality.

The above-mentioned present invention may be applied to a digital broadcast receiving apparatus so that an error rate, which is a function of the signal quality, is monitored and a reference value of the error rate is set for judgment by the wave receiving control device. According to such features of the present invention, it is possible to judge easily whether or not the signal qualities are favorable through a digital processing when utilizing a plurality of systems, thus effectively preventing the error rate from increasing.

In the present invention, the wave transmitting system and the wave receiving system in the transmit wave receiving apparatus may include satellite systems and ground systems so that the above-mentioned control is made in case where the quality of any one of signals is deteriorated. According to such features of the present invention, it is possible to improve the receiving performance under a condition in which the satellite systems and the ground systems are mixed with each other.

In the present invention, the signal levels may also be monitored in addition to the signal qualities so that the wave receiving device is controlled on the basis of the monitoring results. According to such features of the present invention, it is possible to effectively avoid a problem that the transmit wave received through the ground system, which usually have a large signal level when receiving the transmit wave, generates jamming waves due to a multi-pass system, so as to deteriorate the signal quality of the transmit wave received through the satellite system, which usually have a small signal level when receiving the transmit wave.

A transmit wave receiving method of the present invention comprises the steps of:

receiving transmit waves, which are transmitted from a plurality of wave transmitting systems respectively;

monitoring signal levels and signal qualities of the transmit waves thus received;

judging from monitoring results whether the signal qualities of the transmit waves in all of the wave receiving systems are favorable or unfavorable; and halting a wave receiving operation for the transmit wave having a large signal level, when the signal qualities of the transmit waves in all of the wave receiving systems are unfavorable.

The above-mentioned method of the present invention may have the features:

the transmit waves are modulated with a digital signal;
there is monitored an error rate, which is obtained as a function of the signal quality by a digital processing; and
there is set a reference value of the error rate, on a basis of which the signal quality is judged.

DETAILED DESCRIPTION OF THE PREFERRED EMBODIMENTS

Now, embodiments of a transmit wave receiving apparatus of the present invention will be described in detail below with reference to the accompanying drawings. In the embodiment described below, the present invention is applied to a broadcast receiving system in which broadcast information is received through two systems, which are provided on a satellite and the ground.

Figure 1:
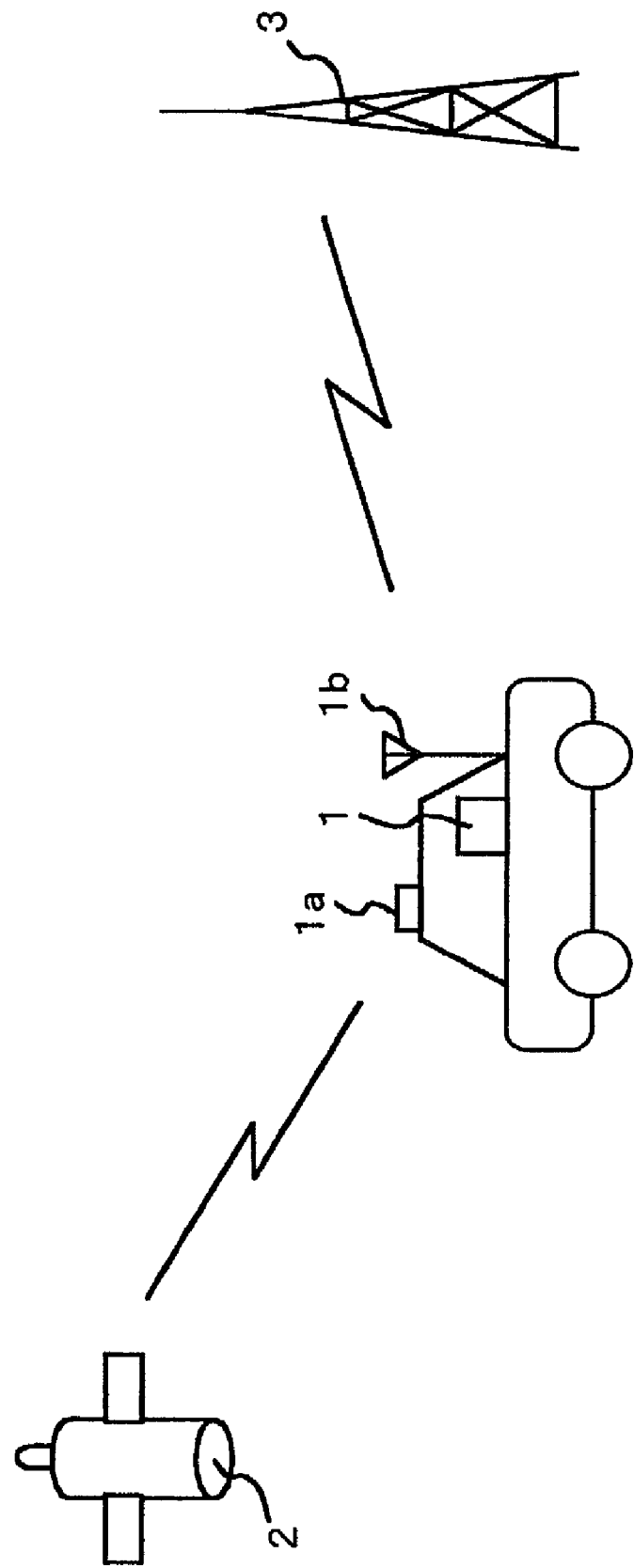
FIG. 1 is a schematic descriptive view illustrating a structure of a broadcast receiving system of the embodiment of the present invention.

FIG. 1 is a schematic descriptive view illustrating a structure of a broadcast receiving system of the embodiment of the present invention. The broadcast receiving system as shown in FIG. 1 includes a broadcast receiving apparatus 1 utilized in a movable body such as a vehicle, a satellite 2 provided with broadcast transmitting equipment serving as the first wave transmitting system and a ground station 3 provided as the second wave transmitting system to transmit broadcast information. The waves transmitted from the satellite 2 and the ground station 3 are allocated to different frequency bands from each other and modulated on the basis of the common program. The broadcast receiving apparatus 1 extracts transmission signals from the transmit waves from both of the satellite 2 and the ground station 3, thus making it possible to reproduce demodulation signals for information such as musical or the other information. In the broadcast receiving system of the present invention, there is adopted a structure in which the common broadcast information can be transmitted through two systems, i.e., the satellite system and the ground system, in order to ensure high reliability of the transmission signals even when radio environment varies as described later.

Description will be given below of the broadcast receiving system to which the present invention is applied so as to be compatible with digital broadcast. Accordingly, all the transmit waves from the satellite 2 and the ground station 3 are modulated with the transmission signals for digital data. In the broadcast receiving apparatus 1, the digital data such as voice data are extracted through a digital processing. The present invention may however be applied not only to a wave transmitting-receiving system compatible with the digital broadcast, but also to a wave transmitting-receiving system compatible with an analog broadcast.

As shown in FIG. 1, the broadcast receiving apparatus 1 is provided with an antenna 1a for receiving the transmit wave from the satellite 2 and the other antenna 1b for receiving the transmit wave from the ground station 3 so as to carry out a receiving processing for broadcast described later. The distance between the broadcast receiving apparatus 1 and the ground station 3 is usually smaller than the distance between the broadcast receiving apparatus 1 and the satellite 2. In such a case, field intensity of the transmit wave from the ground system becomes relatively high and temporal variation in the field intensity is caused by movement of the movable body such as a vehicle.

The broadcast receiving apparatus 1 in which the transmit waves are received in such radio environment is designed on the assumption that the signal quality may be deteriorated under the adverse influence of a multi-pass system. There may be for example a case where radio waves are reflected from the surrounding buildings and other structures during a receiving operation in the vicinity of the ground station 3, with the result that the broadcast receiving apparatus 1 may receive multi-pass signals, which are generated through composition of the reflected wave and the transmit wave, which has not been reflected. In such a case, the signal level of the transmit wave from the ground system is relatively high. Consequently, the multi-pass signals serve as jamming waves so as to cause interference with received signals of the transmit wave from the other system, i.e., the satellite system, in the broadcast receiving apparatus 1, thus deteriorating signal quality of the transmit wave. The embodiment of the present invention copes with such a problem, by controlling a receiving operation in the broadcast receiving apparatus 1 in a manner as described later.

Figure 2:
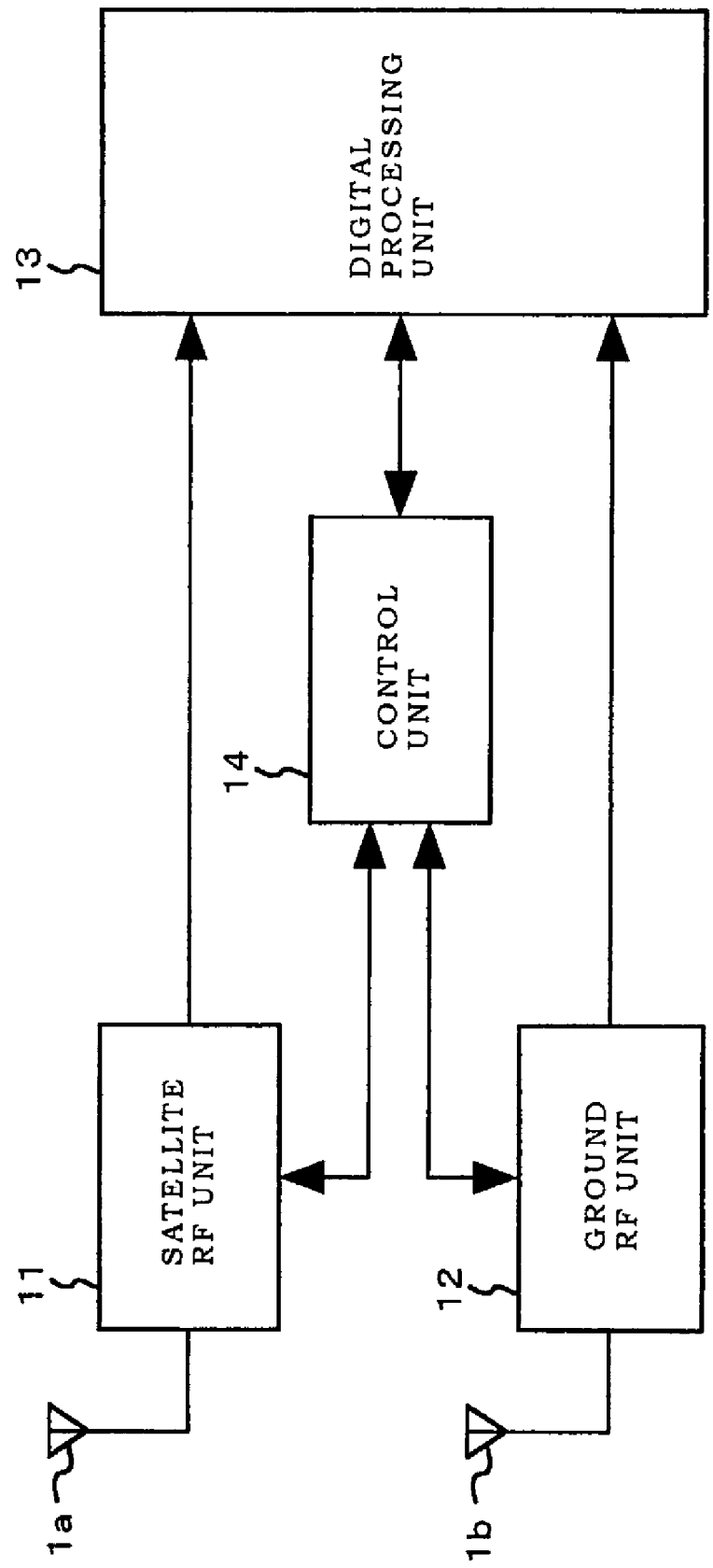
FIG. 2 is a block diagram illustrating a schematic structure of a broadcast receiving apparatus of the embodiment of the present invention.

FIG. 2 is a block diagram illustrating a schematic structure of the above-described broadcast receiving apparatus 1. The broadcast receiving apparatus 1 as shown in FIG. 2 includes a satellite RF unit 11 connected to the antenna 1a, a ground RF unit 12 connected to the other antenna 1b, a digital processing unit 13 and a control unit 14.

As shown in FIG. 2, broadcast waves from the satellite 2 are received through the antenna 1a so that received signals thereof are inputted to the satellite RF unit 11. The satellite RF unit 11, which serves as the wave receiving device, includes a receiving circuit that is compatible with a frequency band of the broadcast wave from the satellite 2. Transmitted radio waves from the ground station 3 are received through the other antenna 1b, on the other hand, so that received signals thereof are inputted to the ground RF unit 12. The ground RF unit 12, which serves as the other wave receiving device, includes a receiving circuit that is compatible with a frequency band of the broadcast wave from the ground station 3.

The structure of the satellite RF unit 11 will be described below with reference to FIG. 3. The ground RF unit 12 has the same structure as that of the satellite RF unit 11. Description given below of the structure of the satellite RF unit 11 can be applied to the ground RF unit 12.

Figure 3:
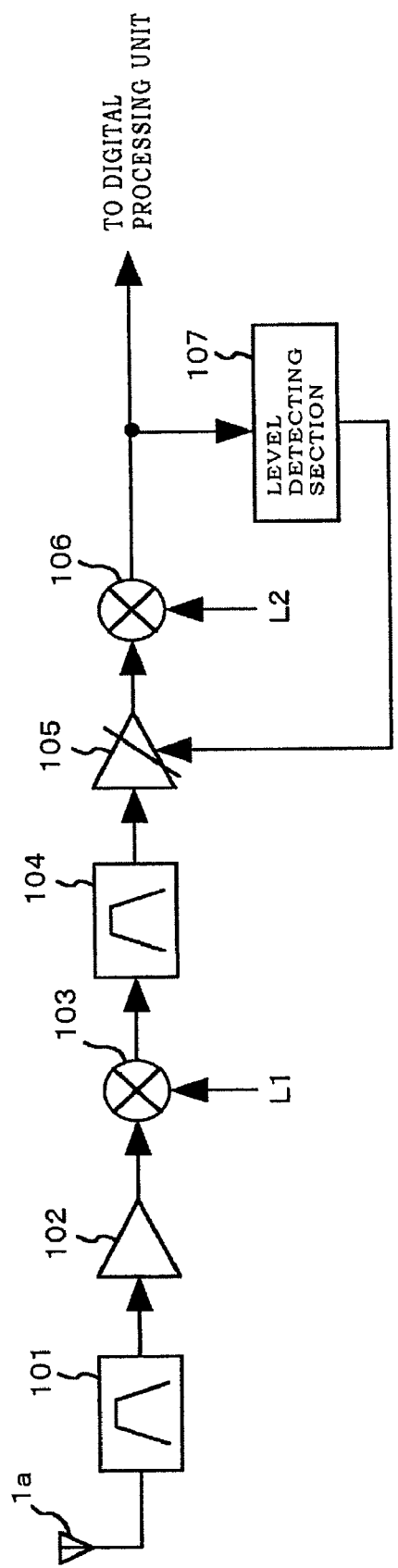
FIG. 3 is a block diagram illustrating a structure of a satellite RF unit of the broadcast receiving apparatus of the embodiment of the present invention.

As shown in FIG. 3, the satellite RF unit 11 includes a tuning circuit 101, the first mixing section 103, the first IF filter 104, an AGC amplifier 105, the second mixing section 106 and a level detecting section 107. In FIG. 3, the received signal from the antenna 1a is tuned into a predetermined frequency band by means of the tuning circuit 101, outputted in the form of RF signal and then amplified with a predetermined gain by means of the RF amplifier 102. The RF signal from the RF amplifier 102 is mixed with an oscillation signal L1 supplied from an oscillator (not shown) in the first mixing section 103 so as to generate the first IF signal having a lower frequency in comparison with the RF signal. The frequency of the first IF signal corresponds to difference in frequency between the RF signal and the oscillation signal L1.

The first IF signal outputted from the first mixing section 103 passes through the first IF filter 104 to remove unnecessary frequency components therefrom, is inputted to the AGC amplifier 105 and then amplified with a predetermined gain. A level detection value described later from the level detecting section 107 also described later is supplied to the AGC amplifier 105 to control the gain so as to maintain a constant level of the first IF signal. The first IF signal outputted from the AGC amplifier 105 is mixed with an oscillation signal L2 supplied from an oscillator (not shown) in the second mixing section 106 so as to generate the second IF signal having a further lower frequency in comparison with the first IF signal. The frequency of the second IF signal corresponds to difference in frequency between the first IF signal and the oscillation signal L2.

The second IF signal outputted from the second mixing section 106 is outputted to the digital processing unit 13 and the level detecting section 107. The level detecting section 107 detects the signal level of the second IF signal as inputted, as mentioned above. The resultant level detection value is outputted to the AGC amplifier 105, as mentioned above, and to the control unit 14 so as to be utilized in a switching operation as described later.

It is also possible to make an on-off control of the power for the satellite RF unit 11 and the ground RF unit 12 on the basis of control signals from the control unit 14 described later, although such a structure is not illustrated in FIG. 3. When the power is turned off, the receiving operation is halted so that the second IF signal is not outputted to the subsequent digital processing unit 13.

As shown in FIG. 2, the respective second IF signals outputted from the satellite RF unit 11 and the ground RF unit 12 are inputted to the digital processing unit 13. The digital processing unit 13, which serves as a demodulating device, has functions of carrying out various digital processing such as demodulation processing to generate the final demodulation signal, on the one hand, and determining an error rate, which is required to make control of the above-mentioned switching operation.

Figure 4:
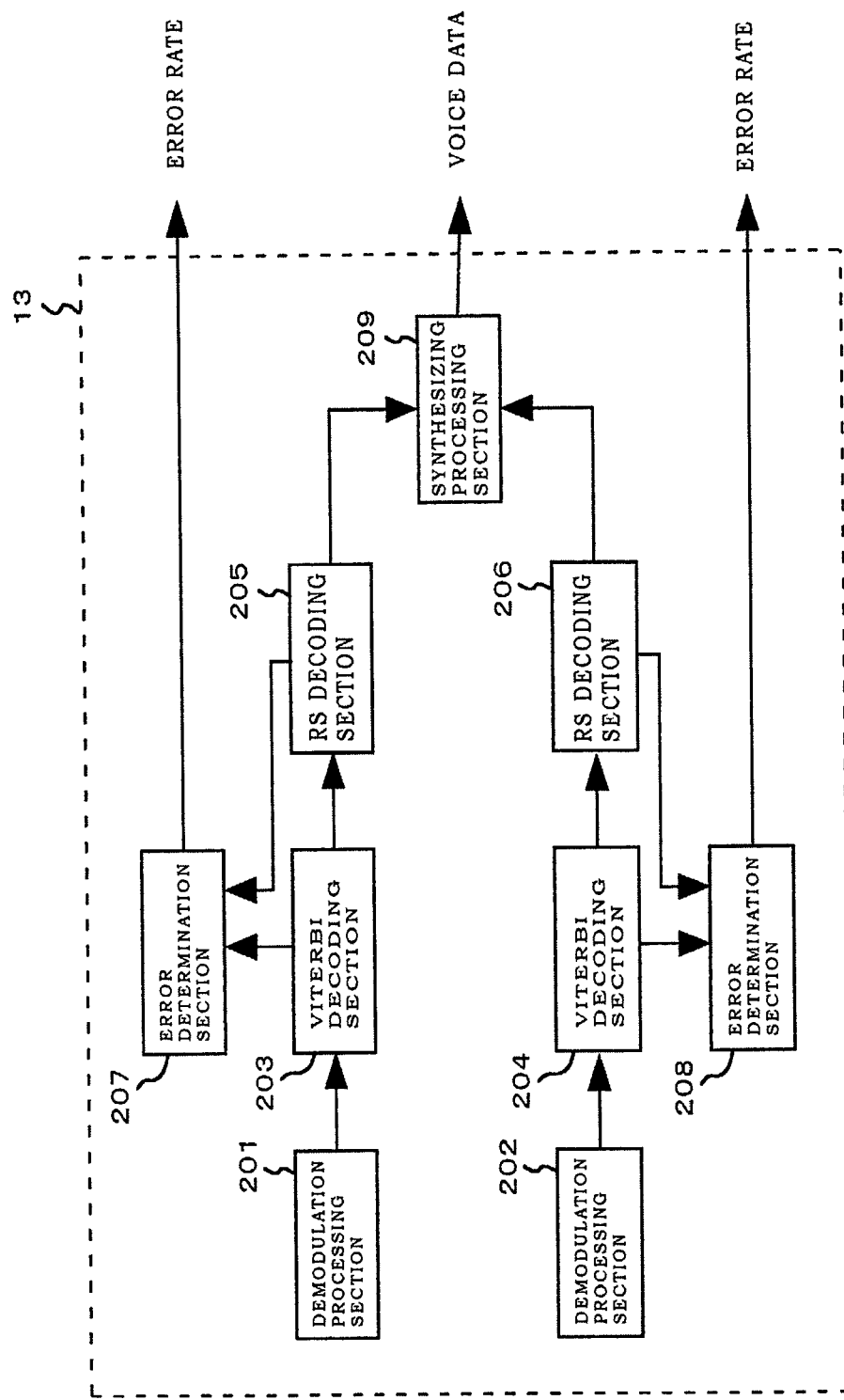
FIG. 4 is a block diagram illustrating a structure of a digital processing unit of the broadcast receiving apparatus of the embodiment of the present invention.

Now, the structure of the digital processing unit 13 will be described below with reference to FIG. 4. As shown in FIG. 4, the digital processing unit 13 includes demodulation processing sections 201, 202, Viterbi decoding sections 203, 204, RS decoding sections 205, 206, error determination sections 207, 208 and a synthesizing processing section 209. The second IF signal outputted from the satellite RF unit 11 is processed by means of the demodulation processing section 201, the Viterbi decoding section 203 and the error determination section 207. The second IF signal outputted from the ground RF unit 12 is processed by means of the demodulation processing section 202, the Viterbi decoding section 204 and the error determination section 208.

As shown in FIG. 4, the demodulation processing section 201 obtains a sampling value corresponding to the second IF signal from the satellite RF unit 11 and carries out a demodulation processing in accordance with a predetermined system. The Viterbi decoding section 203 conducts a convolution processing with the use of the sample value for the predetermined number of bits, which is outputted from the demodulation processing section 201, to generate decoded data. Redundancy is previously added to the sampling value corresponding to the receiving signal, when carrying out the transmitting operation. In the RS decoding section 205, the decoded data from the Viterbi decoding section 203 is subjected to a error correction processing on the basis of Reed-Solomon (RS) code to generate the decoded data.

The error determination section 207 determines the error rate for the decoded data from the Viterbi decoding section 203 in accordance with a predetermined standard so as to send the determination results to the control unit 14. It is therefore possible to judge the signal quality corresponding to the receiving signal in the satellite RF unit 11 on the basis of the error rate determined by the error determination section 207.

The number of errors obtained along with the error correction processing in the RS decoding section 205 may be used as the above-mentioned error rate in the error determination section 207. More specifically, the error rate increases in proportion to increase in number of errors. Accordingly, use of any one of them permits determining of the signal quality.

In respect of the second IF signal from the Ground RF unit 12, the demodulation processing section 202, the Viterbi decoding section 204, the RS decoding section 206 and the error determination section 208, which are shown in FIG. 4, have the same functions as the demodulation processing section 201, the Viterbi decoding section 203, the RS decoding section 205 and the error determination section 207, as described above. In this case, it is possible to judge the signal quality corresponding to the receiving signal in the ground RF unit 12 on the basis of the error rate determined by the error determination section 208.

The synthesizing processing section 209 synthesizes the decoded data from the RS decoding section 205 on the satellite system side and the decoded data from the RS decoding section 206 on the ground system side in accordance with an appropriate pattern to generate the voice data. It is preferable to generate the voice data in the synthesizing processing section 209 utilizing the two systems on the satellite side and the ground side. It is however possible to generate the voice data utilizing only one of the above-mentioned systems, when the signal quality of the transmit wave from one of the systems is unfavorable.

Referring to FIG. 2, the control unit 14 totally controls the respective operations of the satellite RF unit 11, the ground RF unit 12 and the digital processing unit 13. In the embodiment of the present invention, the control unit 14 monitors not only the above-mentioned signal levels detected by means of the satellite RF section 11 and the ground RF section 12, but also the error rates on both of the satellite system side and the ground system side, which are detected by means of the digital processing unit 13, so as to make an on-off control of the power on the basis of the signal levels and the error rates. The control unit 14 serves as the signal monitoring device and the wave receiving control device of the present invention in this manner.

Now, description will be given below of the flow of the receiving control processing, which is carried out by the control unit 14 of the broadcast receiving apparatus 1, with reference to the flowchart in FIG. 5. The processing as shown in FIG. 5 is carried out by the control unit 14 in an appropriate manner, during the broadcast receiving operation.

Figure 5:
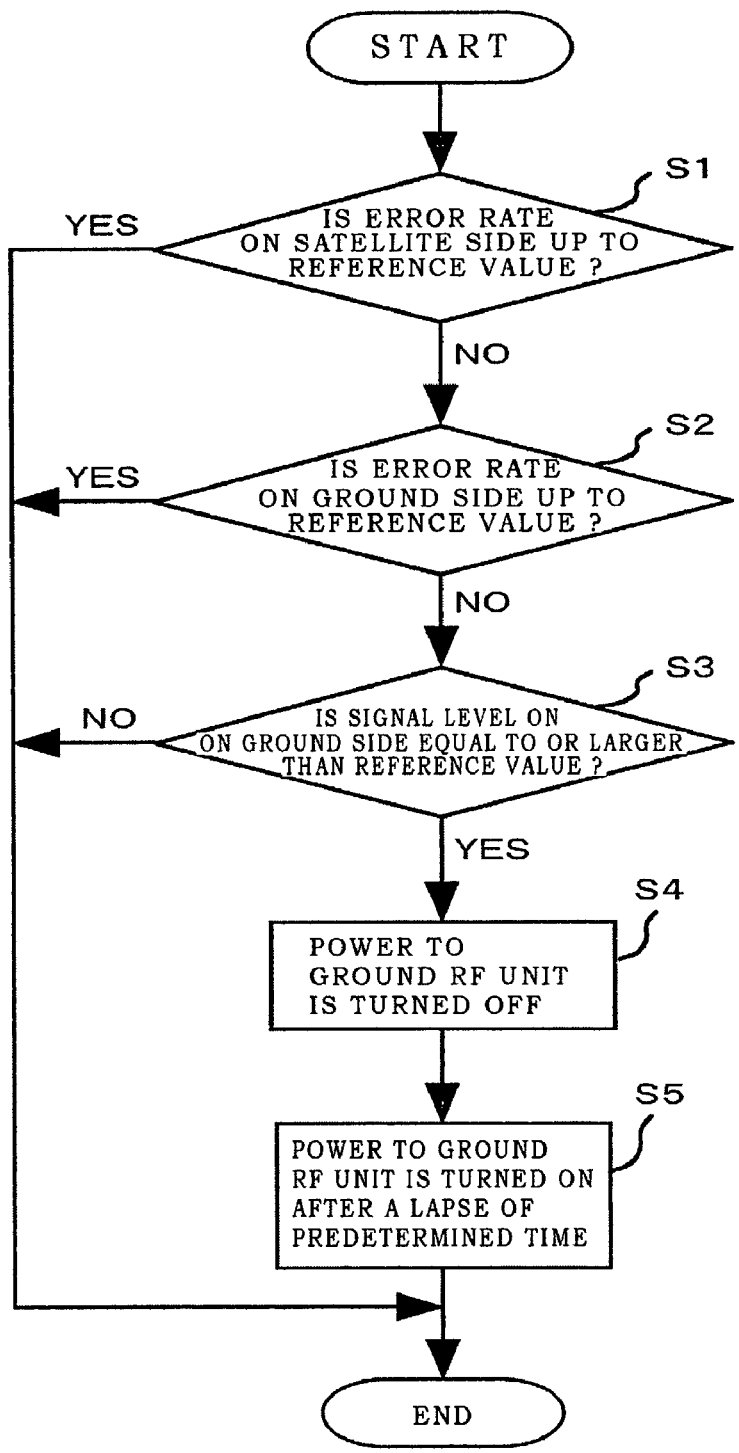
FIG. 5 is a flowchart illustrating the flow of a receiving control processing by a control unit of the broadcast receiving apparatus of the embodiment of the present invention.

As shown in FIG. 5, the error rate on the satellite system side, which is sent from the error determination section 207 of the digital processing unit 13 is discriminated and it is judged as whether or not the error rate thus discriminated on the satellite system side is equal to or less than the predetermined reference value (Step S1). Then, the error rate on the ground system side, which is sent from the error determination section 208 of the digital processing unit 13 is discriminated and it is judged as whether or not the error rate thus discriminated on the ground system side is equal to or less than the predetermined reference value (Step S2). Steps S1 and S2 confirm as whether or not the respective signal qualities on the satellite system side and the ground system side have been deteriorated.

When each of the judgment results in Steps S1 and S2 represents "NO", the signal level on the ground system side, which is sent from the level detecting section 107 of the ground RF unit 12 is discriminated and it is judged as whether or not the signal level thus discriminated on the ground system side is equal to or larger than the predetermined reference value (Step S3). These steps are carried out on the assumption that the signal quality on the satellite system side may be deteriorated due to increase in the signal level on the ground system side.

When the judgment result in Step S3 represents "YES", the power is turned off to halt the receiving operation in the ground RF unit 12 (Step S4). The second IF signal from the ground RF unit 12 is not subsequently outputted to the digital processing unit 13. Consequently, the synthesizing processing section 209 of the digital processing unit 13 generates the voice data, utilizing only the decoded data on the satellite system side.

After a lapse of a predetermined period of time, the power for the ground RF unit 12, which has been turned off in Step S4, is turned on again through a switching operation (Step S5) so that the processing as shown in FIG. 5 is completed. As a result, the ground RF unit 12 is restored to the original operating state so as to generate the voice data in the synthesizing processing section 209 of the digital processing unit 13, utilizing the decoded data from both of the satellite system side and the ground system side. With respect to the above-mentioned predetermined period of time in Step S5, there may be set a necessary period of time during which stability is given to the receiving condition in accordance with assumable radio environment.

When the judgment result in Step S1 or S2 represents "YES", or the judgment result in Step S3 represent s "NO", neither Steps S4 nor S5 is carried out. More specifically, the synthesizing processing section 209 of the digital processing unit 13 continues to generate the voice data, utilizing the decoded data from both of the satellite system side and the ground system side.

The receiving control processing in Steps S1 to S5, which are carried out in this manner, makes it possible to avoid the adverse effect on the satellite system under conditions in which the field intensity of the transmit wave from the ground system is relatively high and the signal quality is deteriorated, as described above. More specifically, there easily occurs interference of the ground RF unit 12 with the satellite RF unit 13 due to a relative difference in field intensity, when the signal quality is deteriorated due to the multi-pass system in the ground system. In order to avoid such problems, the power for the ground RF unit 12 is turned off. It is therefore possible to interrupt a route, which exerts the adverse influence on the satellite RF unit 11, thus ensuring the original signal quality, which is determined by the receiving conditions in the satellite RF unit 11.

In the above-described embodiment, there is made an on-off control of the power for the ground RF unit 12 by the control unit 14. The other controlling measures may be applied. For example, the signal route for the ground RF unit 12 may be provided with a switch so that such a switch is turned off in Step S4 as described above. In such a control system, an outputting operation of any signal to the subsequent digital processing unit 13 is halted, thus providing the same effects.

In the above-described embodiment, the wave receiving operation in the ground system is halted in order to prevent receiving interference with the satellite system. However, the present invention is not limited only to such an embodiment. When the signal level from the ground system is relatively low, there may be adopted a structure of halting the receiving operation in the satellite system in which the signal level is relatively high, in order to prevent the receiving interference. More specifically, the present invention is applicable to maintain a favorable signal quality in the system in which the signal level is relatively low, as long as the receiving operation in the system in which the signal level is relatively high and the signal quality is deteriorated, is halted.

In the above-described embodiment, there is described the broadcast receiving system utilizing two radio systems, i.e., the satellite system and the ground system. However, the present invention is not limited only to such an embodiment. The present invention may be applied to a system utilizing three or more radio systems. In the above-described embodiment, the single ground system is subjected to the controlling step. The present invention may be applied to the other system in which there is a plurality of systems to be controlled, utilizing for example a plurality of ground systems.

The entire disclosure of Japanese Patent Application No. 2001-305650 filed on Oct. 1, 2001 including the specification, claims, drawings and summary is incorporated herein by reference in its entirety.

What is claimed is:

1. A transmit wave receiving apparatus comprising:
a wave receiving device for receiving transmit waves, which are transmitted from a plurality of wave transmitting systems respectively;
a signal monitoring device for monitoring signal levels and signal qualities of the transmit waves, which are received by the wave receiving device; and
a wave receiving control device for controlling the wave receiving device so as to halt a wave receiving operation for a transmit wave having a signal level larger than a specified reference level, when it is judged from monitoring results by the signal monitoring device that all of the transmit waves received by the wave receiving device do not satisfy a specified signal quality level.

2. The apparatus as claimed in claim 1, wherein:
the transmit waves are modulated with a digital signal;
the signal monitoring device monitors an error rate, which is obtained as a function of the signal quality by a digital processing; and
a reference value of the error rate, on a basis of which the signal quality is judged, is set in the wave receiving control device.

3. A transmit wave receiving apparatus comprising:
a wave receiving device for receiving transmit waves, which are transmitted from a satellite system and a ground system respectively;
a signal monitoring device for monitoring signal levels and signal qualities of the transmit waves, which are received by the wave receiving device; and
a wave receiving control device for controlling the wave receiving device so as to halt a wave receiving operation for the transmit waves for the ground system for a specified period of time, when it is judged from monitoring results by the signal monitoring device that the signal qualities of the transmit waves in both of the satellite system and the ground system are unfavorable and that the signal level of the transmit waves for the ground system is equal to or more than a specified value.

4. A transmit wave receiving method comprising:

receiving transmit waves, which are transmitted from a plurality of wave transmitting systems respectively;

monitoring signal levels and signal qualities of the transmit waves thus received;

judging from monitoring results whether all of the received transmit waves satisfy a specified signal quality standard;

halting a wave receiving operation for a transmit wave having a signal level larger than a specified reference level, when all of the received transmit waves do not satisfy the specified signal quality standard.

5. The method as claimed in claim 4, wherein:

the transmit waves are modulated with a digital signal;

there is monitored an error rate, which is obtained as a function of the signal quality by a digital processing; and there is set a reference value of the error rate, on a basis of which the signal quality is judged.

6. The method as claimed in claim 4, wherein the plurality of wave transmitting systems comprises a satellite transmitting system and a ground-based transmitting system.

7. A wave receiving apparatus comprising:

a first wave receiving section for receiving waves transmitted from a transmitter for a first communication system;

a second wave receiving section for receiving waves transmitted from a transmitter for a second communication system, the distance between the transmitter for the second communication system and the wave receiving apparatus being smaller than the distance between the transmitter for the first communication system and the wave receiving apparatus;

a signal monitoring section for monitoring signal levels and signal error rates of the waves received by the first and second wave receiving sections; and a wave receiving control section for halting an operation of the second wave receiving section if the monitored signal level of waves received by the second wave receiving section exceeds a reference signal level and if the monitored signal error rates of the waves received by the first and second wave receiving sections exceed a reference signal error rate.

8. The wave receiving apparatus as claimed in claim 7, wherein the waves transmitted from the transmitter for the first communication system and the waves transmitted from the transmitter for the second communication system comprise common broadcast information.

9. The wave receiving apparatus as claimed in claim 7, further comprising:

a synthesizing processing section for selectively synthesizing demodulated and decoded representations of the waves received by the first and second wave receiving sections.

10. The wave receiving apparatus as claimed in claim 7, wherein the halted operation of the second wave receiving section is re-started after a specified period of time passes.

11. The wave receiving apparatus as claimed in claim 10, wherein the specified period of time is determined in accordance with a communication environment.

12. The wave receiving apparatus as claimed in claim 7, wherein the halted operation of the second wave receiving section is halted by powering down the second wave receiving section.

13. The wave receiving apparatus as claimed in claim 7, wherein the halted operation of the second receiving section comprises a signal output operation.

14. The wave receiving apparatus as claimed in claim 7, wherein the first communication system is a satellite communication system and the second communication system is a ground-based communication system.

15. The wave receiving apparatus as claimed in claim 7, wherein the waves transmitted from the transmitters for the first and second communication systems comprise voice data.

16. A mobile wave receiving apparatus comprising the wave receiving apparatus as claimed in claim 7.

* * * * *